(12) United States Patent
Barlage et al.

(10) Patent No.: US 12,720,808 B2
(45) Date of Patent: Aug. 25, 2026

(54) SOURCE/DRAIN CHANNEL INTERFACE WITH NITROGEN-CONTAINING OXIDE

(71) Applicant: Zinite Corporation, Edmonton (CA)

(72) Inventors: Douglas Barlage, Edmonton (CA); Gem Shoute, Edmonton (CA)

(73) Assignee: Zinite Corporation, Edmonton (CA)

( * ) Notice: Subject to any disclaimer, the term of this patent is extended or adjusted under 35 U.S.C. 154(b) by 0 days.

(21) Appl. No.: 19/350,840

(22) Filed: Oct. 6, 2025

(65) Prior Publication Data

US 2026/0107515 A1 Apr. 16, 2026

Related U.S. Application Data

(60) Provisional application No. 63/705,990, filed on Oct. 10, 2024.

(51) Int. Cl.
*H10D 30/67* (2025.01)
*H10D 64/23* (2025.01)

(52) U.S. Cl.
CPC ..... *H10D 30/6737* (2025.01); *H10D 30/6755* (2025.01); *H10D 64/251* (2025.01)

(58) Field of Classification Search
None
See application file for complete search history.

(56) References Cited

U.S. PATENT DOCUMENTS 8,853,695 B2 10/2014 Hino et al.
9,136,355 B2 9/2015 Ahmed
10,082,714 B2 9/2018 Yao
10,731,273 B2 8/2020 Meldrim et al.
11,949,019 B2 4/2024 Barlage et al.
2009/0224238 A1 9/2009 Kim et al.
2010/0237386 A1 9/2010 Lin et al.
2014/0131704 A1 5/2014 Yamazaki et al.
2018/0190824 A1 7/2018 Bae et al.
(Continued)

FOREIGN PATENT DOCUMENTS

EP 2339638 A1 6/2011
GB 2571351 A 8/2019
(Continued)

OTHER PUBLICATIONS

Jeong et al., Specific contact resistivity reduction in amorphous IGZO thin-film transistors through a TiN/IGTO heterogeneous interlayer, scientific reports, 14:10953, May 2024, 9 pages.
(Continued)

*Primary Examiner* — Khaja Ahmad
(74) *Attorney, Agent, or Firm* — MLO, a professional corp.

(57) ABSTRACT

An example thin-film transistor includes a source including a body of source material, a drain including a body of drain material, a gate, and a body of semiconductor channel material between the source and the drain. The body of semiconductor channel material includes a metal oxide. The thin-film transistor further includes a source-channel interface between the body of source material and the body of semiconductor channel material. The source-channel interface includes a nitrogen-containing metal oxide. A similar or identical drain-channel interface may be provided. The nitrogen-containing metal oxide may be formed using plasma.

14 Claims, 3 Drawing Sheets

(56) References Cited

U.S. PATENT DOCUMENTS

| | | | | |
|---|---|---|---|---|
| 2020/0006575 | A1 | 1/2020 | Dewey et al. | |
| 2020/0098931 | A1 | 3/2020 | Sharma et al. | |
| 2020/0135771 | A1 | 4/2020 | Park et al. | |
| 2020/0203432 | A1 | 6/2020 | Rachmady et al. | |
| 2020/0266281 | A1* | 8/2020 | Yamazaki | H10D 64/681 |
| 2021/0202760 | A1 | 7/2021 | Jang et al. | |
| 2022/0059409 | A1* | 2/2022 | Yamazaki | H10D 84/038 |
| 2024/0038896 | A1 | 2/2024 | Jang et al. | |
| 2024/0213370 | A1 | 6/2024 | Barlage et al. | |
| 2025/0087285 | A1 | 3/2025 | Chang | |

FOREIGN PATENT DOCUMENTS

| | | | |
|---|---|---|---|
| JP | 2000036603 | A | 2/2000 |
| JP | 3253936 | B2 | 2/2002 |
| KR | 20140125325 | A | 10/2014 |
| KR | 101827514 | B1 | 2/2018 |
| KR | 20200035170 | A | 4/2020 |
| WO | 2017052650 | | 3/2017 |
| WO | 2018176829 | A1 | 10/2018 |
| WO | 2020109816 | A2 | 6/2020 |
| WO | 2021198836 | A1 | 10/2021 |
| WO | 2023285936 | A1 | 1/2023 |
| WO | 2024165987 | A1 | 8/2024 |

OTHER PUBLICATIONS

International Search Report and Written Opinion dated Dec. 24, 2025 for PCT Patent Application No. PCT/IB2025/060100.

* cited by examiner

SOURCE/DRAIN CHANNEL INTERFACE WITH NITROGEN-CONTAINING OXIDE

RELATED APPLICATIONS

This application claims priority to U.S. Provisional Application No. 63/705,990 filed on Oct. 10, 2024 and titled "Source/Drain Treatment with Nitrogen-Containing Plasma"; which is hereby incorporated by reference in full.

FIELD

The present disclosure relates to thin-film transistors and related methods.

BACKGROUND

Thin-film transistors (TFTs) are widely used in display devices and are increasingly used in other applications. A conventional TFT is composed of thin films of materials formed in sequence to create a stack-like arrangement. Such thin films are normally of nanometer-scale thickness.

The manufacture and operation of TFTs are heavily dependent on the materials and processes used. In order to expand the useful applications TFTs, it is helpful to investigate new materials and develop new processes.

SUMMARY

According to an aspect of the present disclosure, a thin-film transistor includes a source including a body of source material, a drain including a body of drain material, a gate, and a body of semiconductor channel material between the source and the drain. The body of semiconductor channel material includes a metal oxide. The thin-film transistor further includes a source-channel interface between the body of source material and the body of semiconductor channel material. The source-channel interface includes a nitrogen-containing metal oxide.

The source-channel interface may include a nitrogen-containing oxide of a metal that is the source material.

The body of source material may include ruthenium and the source-channel interface may include nitrogen-containing ruthenium oxide.

The thin-film transistor may further include a drain-channel interface between the body of drain material of the drain and the body of semiconductor channel material. The drain-channel interface may include the nitrogen-containing metal oxide.

The source-channel interface may include 15% or less nitrogen.

The source-channel interface may further include 1% or less chlorine.

The source-channel interface may further include 1% or less fluorine.

According to another aspect of the present disclosure, a method of manufacturing a thin-film transistor includes forming a body of source material, forming a source-channel interface at the body of source material, and forming a body of semiconductor channel material including a metal oxide in contact with the source-channel interface. Forming the source-channel interface comprises applying a nitrogen-containing plasma to the body of source material.

The nitrogen-containing plasma may be formed with any one or combination of nitrous oxide, nitrogen dioxide, and nitric oxide.

The nitrogen-containing plasma may be formed with any one or combination of ammonia and ammonium.

Forming the source-channel interface may further include applying an oxygen-containing plasma to the body of source material.

The method may further include forming a body of drain material and forming a drain-channel interface at the body of drain material. The metal oxide of the body of semiconductor channel material may be in contact with the drain-channel interface. Forming the drain-channel interface comprises applying the nitrogen-containing plasma to the body of drain material.

Forming the source-channel interface may further include applying chlorine plasma to the body of source material.

Forming the source-channel interface may further include applying fluorine plasma to the body of source material.

According to another aspect of the present disclosure, a thin-film transistor includes a source including a body of source material formed of a metal, a drain including a body of drain material formed of the metal, and a body of semiconductor channel material between the source and the drain. The body of semiconductor channel material includes a metal oxide. The thin-film transistor further includes a source-channel interface at the body of source material and in contact with the body of semiconductor channel material and a drain-channel interface at the body of drain material and in contact with the body of semiconductor channel material. The source-channel interface and the drain channel interface include a nitrogen-containing oxide of the metal.

The semiconductor channel material may be tin oxide.

The metal may be ruthenium.

The source-channel interface and the drain-channel interface may include 15% or less nitrogen.

According to another aspect of the present disclosure, a method of manufacturing a thin-film transistor includes forming a body of source material, forming a source-channel interface at the body of source material, and forming a body of semiconductor channel material including a metal oxide in contact with the source-channel interface. Forming the source-channel interface comprises introducing a non-plasma source of nitrogen to the body of source material.

The non-plasma source of nitrogen may be ammonia or ammonium.

The method may further include preserving or reforming a native oxide on the body of source material before introducing a non-plasma source of nitrogen.

DETAILED DESCRIPTION

A typical thin-film transistor (TFT) includes a source, drain, gate, and semiconductor channel material. When a voltage is applied between the source and drain and a suitable voltage is applied to the gate, a carrier channel forms in the semiconductor material causing current to flow between source and drain.

Various improvements may be made to TFTs to allow for greater efficiency. In U.S. Pat. No. 11,949,019, which is incorporated herein by reference, Barlage et al. teach a channel interfacial member at the source/drain that, among other things, reduces off current, which in turn reduces power consumption and may provide other benefits. However, such channel interfaces, particularly when they are quite thin (e.g., on the order of 1 nm), may be subject to instability that prevents their full potential from being realized in certain circumstances. For example, hydrogen that is often used during manufacture of TFTs and other semiconductor devices (e.g., as a constituent of forming gas) may act to reduce the channel interface to an undesirable degree during manufacture, thereby degrading its intended function.

The present disclosure relates to a channel interface formed of a nitrogen-containing metal oxide. While the metal oxide material without nitrogen can function as an effective channel interface, the added nitrogen can increase the stability and toughness of the channel interface material, so that the channel interface is better able to retain its desired characteristics through the manufacturing process.

Such a channel interface may be manufactured by, for example, exposing the source material (and, optionally, the drain material) to nitrogen-containing plasma. The nitrogen-containing plasma may also include oxygen. Alternatively, oxygen-containing plasma may be used before and/or after the nitrogen-containing plasma. In another alternative, a source of non-plasma nitrogen may be introduced to the native oxide of the source material. Such treatments create a source-channel interface (and, optionally, a drain-channel interface) of metal oxide augmented with nitrogen to provide low off current operation of the TFT with increased toughness and/or stability in the presence of hydrogen. Examples of compounds that may be used to form the nitrogen-containing plasma include nitrous oxide ($N_2O$), nitrogen dioxide ($NO_2$), nitric oxide (NO), ammonia ($NH_3$), and ammonium ($NH_4$). In addition to or as an alternative to the aforementioned compounds, nitrogen gas ($N_2$) may be used to form a nitrogen-containing plasma.

Figure 1:
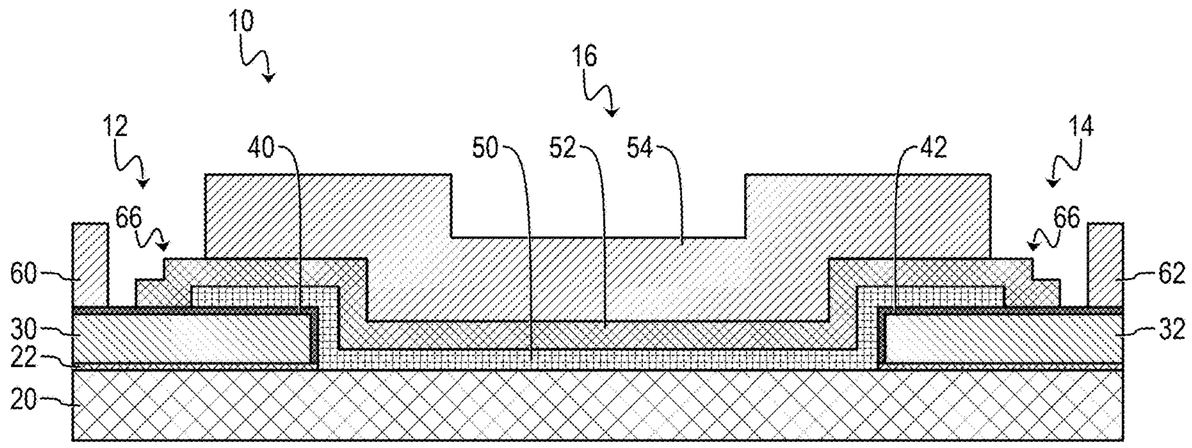
FIG. 1 is a cross-sectional view of an example thin-film transistor that includes a source/drain channel interface including a nitrogen-containing metal oxide.

FIG. 1 shows an example TFT 10 according to the present disclosure. The TFT 10 includes a source 12, drain 14, and gate 16. In various examples, the TFT 10 may be manufactured using back-end-of-line (BEOL), middle-of-line (MOL) processes, and/or back-side (Bside) processes.

The TFT 10 is formed with a planar substrate 20. The substrate 20 may be disposed over another layer of TFTs, whether manufactured in accordance with the present disclosure or by another technique. For example, the substrate 20 may be disposed over a layer of complementary metal-oxide-semiconductor (CMOS) devices or over another layer of TFTs 10.

Examples of materials for the substrate 20 include silicon dioxide; silicon nitride; glass; fluorosilicate glass (FSG); a silicon wafer whose surface is processed with wet thermal oxide (WTO) or similar treatment; carbon doped oxide (CDO); organic polymers such as perfluorocyclobutane or polytetrafluoroethylene; organosilicates such as silsesquioxane, siloxane, organosilicate glass; flexible polymer; plastic; etc. Suitable combinations of such materials may also be used.

An adhesion layer 22 may be formed over the substrate 20 to promote adhesion of material to the substrate 20. The adhesion layer 22 may be formed of titanium nitride, hafnium nitride, or similar material.

The source 12 is formed of a body of source material 30 disposed on the substrate 20. The source material may be a metal or alloy, such as ruthenium or an alloy where ruthenium is the majority constituent. Other examples of source metals include tungsten, cobalt, and molybdenum. The body of source material 30 can be formed by sputtering, or other thin film deposition techniques. The body of source material 30 can have a thickness of about 25 nm, about 10 nm, about 15 nm, about 20 nm, about 30 nm, or greater than 30 nm.

In this example, the drain 14 is formed of a body of drain material 32 and has the same or similar material and/or structure as the source 12. In other examples, the drain 14 has a material and/or structure different to the source 12. The term "source/drain" as used herein describes a component related to a source and/or drain, as the case may be. For example, a "source/drain material" is a material that may be used for the source, the drain, or both.

The adhesion layer 22 promotes the adhesion of the bodies of source and drain material 30, 32 to the substrate 20. In other examples, the adhesion layer 22 may be omitted if the source/drain material has suitable adhesion without it.

The body of source material 30 may be subject to inline treatment, such as plasma treatment, anneal treatment, chemical or electro-chemical treatment, or similar. Different types of treatment may be combined. A treatment may be repeated two or more times.

The treatment forms a source-channel interface 40 at the body of source material 30 at least between the body of source material 30 and the body of channel material 50. The source-channel interface 40 may be p-type. The source-channel interface 40 may tune the threshold voltage at which TFT 10 turns on, and reduce leakage current through TFT 10 in the off state. The source-channel interface 40 may create a repository of complimentary excess negative charge that functions to deplete the channel in at least the region of the body of channel material 50 adjacent the body of source material 30. In this manner, the source-channel interface 40 serves as a voltage-controlled electron transport barrier, resulting in substantially less current flow through body of channel material 50 when TFT 10 is in an off state. Further, the source-channel interface 40 may also serve to reduce stress induced leakage currents ("SILC") in TFT 10 by inhibiting the formation of interlayer stress-induced flaws between the body of channel material 50 and the body of source material 30. A drain-channel interface 42 may be similarly formed and may have similar characteristics, but it is contemplated that the source-channel interface 40 provides significant benefit without the drain-channel interface 42. The source-channel interface 40 may provide most or all of the benefit.

In various examples, ruthenium metal bodies of source and drain material 30, 32 are treated with a nitrogen-containing plasma and an oxygen-containing plasma, which may be the same plasma, to form a layer of nitrogen-containing ruthenium oxide that are the source and drain channel interfaces 40, 42. Such a layer may be very thin and, for example, may have a thickness of less than about 1.5 nm, or less than about 1 nm, or less than about 0.5 nm.

The source and drain channel interfaces 40, 42 may be non-homogeneous, particularly when nitrogen concentration is lower than a stoichiometric oxynitride. In other examples, an interface 40, 42 may have sufficient nitrogen to be a stoichiometric or near-stoichiometric oxynitride.

The source-channel interface 40 may have an amount of nitrogen that does not cause segregation in the resulting nitrogen-containing metal oxide. Various factors influence the proportion of nitrogen that will cause segregation to a degree that is undesired. In various examples, it is contemplated that that source-channel interface 40 has an atomic concentration of nitrogen of about 15% or less, about 10% or less, about 5% or less, or about 2% or less. The percentages given are with respect to metal oxide (e.g., $RuO_2$) molecules.

Chlorine, fluorine, or similar elements, such as iodine and bromine, may be added to the source-channel interface 40. Chlorine may improve the structural and electrical characteristics of the source-channel interface 40. Chlorine may additionally or alternatively increase the breakdown field of the interface 40. Fluorine may increase the hardness of the source-channel interface 40. Iodine and bromine may provide similar benefits.

In various examples, the atomic concentration of chlorine and/or fluorine, whether used alone or in combination, is limited to about 1% or less with respect to metal oxide (e.g., $RuO_2$) molecules. The allowable amount of nitrogen may need to be reduced by about the same percentage to prevent undesirable segregation.

In one example, the source-channel interface 40 is ruthenium oxide with about 1% nitrogen and about 1% chlorine. Chlorine introduces electrons to the interface 40 and nitrogen introduces holes. Ideally, the concentration of nitrogen and chlorine is the same so that the interface is electrically balanced (i.e., the concentration of added electrons equals the concentration of added holes). If the concentrations cannot be made equal, a higher nitrogen concentration is preferable, as slight excess holes can be considered non-participatory.

The above discussion of nitrogen, chlorine, fluorine, and respective concentrations, etc. also applies to the drain-channel interface 42, if used.

The TFT 10 further includes a body of channel material 50 disposed between the source 12 and drain 14. In this example, the body of channel material 50 is disposed partially over the bodies of source and drain material 30, 32 and over the substrate 20 between the bodies of source and drain material 30, 32. The body of channel material 50 is an n-type metal oxide. In this example, the body of channel material 50 is a layer of tin oxide, which is primarily or entirely tin (IV) dioxide ($SnO_2$, which may be referred to as simply "tin oxide"), with a thickness of about 5 nm to about 10 nm. In this example, the layer of tin oxide is about 7 nm thick.

The tin oxide forming the body of channel material 50 is generally polycrystalline or, more specifically, nanocrystalline. The tin oxide may have a preferred crystallite orientation of Miller index <110> with respect to powder, for example, as determined using grazing-incidence x-ray diffraction (GI-XRD) with ω=0.5° on 20 nm and/or 40 nm thick samples. Nanocrystalline tin oxide with this preferred crystal orientation can provide good carrier mobility and good stability, which can improve the performance and useful life of the TFT 10. In other examples, other crystal structures and/or orientations of tin oxide may be used.

For sake of clarity, a tin oxide crystal or crystallite with an orientation of <110> has one of the directions in the family of directions <110>, such as direction [110], substantially normal to the plane of the substrate 20. In other words, a plane of the family {110}, such as the plane (110), of the crystal or crystallite is substantially parallel to the plane of the substrate 20. Additionally, a preferred crystallite orientation of a film is with respect to powder, meaning that a crystallite orientation is preferred if present in a proportion higher than found in powder standard.

In some cases, the crystallinity of the thin film of tin oxide is at least about 70%. Regions outside the 2θ angular range of 20-60° may be ignored when computing crystallinity.

In various examples, the thin film of tin oxide has a mobility of greater than or equal to 100 $cm^2/V \cdot s$ and a carrier concentration of less than or equal to $1.0 \times 10^{19}$ $cm^{-3}$, where these values are measured using a test structure to determine the properties of the film, as opposed to being measured in a completed TFT 10.

The TFT 10 further includes a body of gate dielectric material 52 disposed over the body of channel material 50. Examples of gate dielectric materials include high-k dielectric materials, hafnium oxide, silicon dioxide, silicon nitride, zirconium oxide, and aluminum oxide. In this example, the body of gate dielectric material 52 is a layer of hafnium oxide about 10 nm to about 15 nm thick, such as about 12.5 nm thick.

The TFT 10 further includes a body of gate material 54 (also termed "gate metal") disposed over the gate dielectric material 52. The gate material 54 is a conductor. Examples of gate materials include tungsten, titanium, titanium nitride, molybdenum, gold, platinum, aluminum, nickel, copper, chromium, hafnium, indium, manganese, iron, vanadium, zinc, tantalum, or alloys/combinations thereof. In this example, the body of gate material 54 is a layer of tungsten about 20 nm to about 40 nm thick, such as about 30 nm thick.

The TFT 10 further includes a source electrode 60 as part of the source 12 and a drain electrode 62 as part of the drain 14. The source electrode 60 is in electrical contact with the body of source material 30 to conduct current to/from the body of source material 30. Likewise, the drain electrode 62 is in electrical contact with the body of drain material 32 to conduct current to/from the body of drain material 32. Examples of materials for electrodes 60, 62 include the gate materials listed above.

In operation, when a voltage is applied across the source electrode 60 and a drain electrode 62, and when a suitable voltage is applied to the body of gate material 54, a carrier channel forms in the body of channel material 50, which causes flow of current from source 12 to drain 14. When the voltage is removed, the flow of current is reduced to a very low amount, assisted by the source-channel interface 40 and, optionally, the drain-channel interface 42. On-off ratios of about $10^{10}$ or greater may be achieved with the source-channel interface 40.

Figure 2:
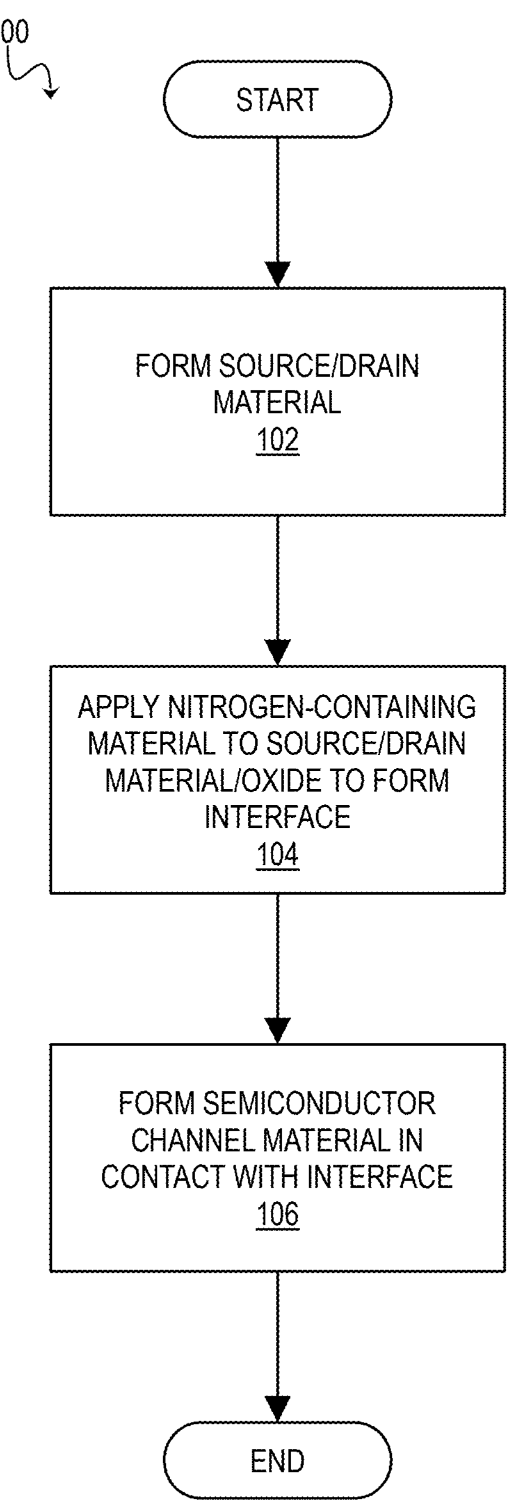
FIG. 2 is a flowchart of an example method of making a thin-film transistor that includes a source/drain channel interface including a nitrogen-containing metal oxide.

FIG. 2 shows an example method 100 of making a TFT described herein, such as the TFT 10, which will be referenced as an example in the below discussion.

The method 100 may use MOL processes, BEOL processes, BSide processes, or a combination of such. The method 100 may be used to form a layer of TFTs over another layer of TFTs, made according to this disclosure or conventionally made, or over a layer of CMOS devices.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (e.g., chemical vapor deposition or CVD, atomic layer deposition or ALD, physical vapor deposition or PVD, etc.), plasma-enhanced/assisted atomic layer deposition (PEALD/PAALD), thermal ALD (T-ALD), plasma-enhanced chemical vapor deposition (PECVD), sputtering, lithography/ photolithography, etching, implantation, annealing, oxidation, and similar processes. While examples of specific types of forming are given below, it should be understood that comparable methods of forming may be alternatively or additionally used, unless otherwise mentioned, without departing from the present disclosure.

During manufacture, the TFT 10 in its partially or fully complete state may be subject to high temperatures and/or environments/materials that contain hydrogen, such as a forming gas (i.e., nitrogen and hydrogen) anneal, as may be required for various reasons, such as to stabilize material or to support the forming of material of the TFT 10 or other materials, components, or devices that are formed before or after the TFT 10 is formed. For example, the forming of interlayer dielectric (ILD) may involve forming gas anneal, the use of silane ($SiH_4$) may introduce hydrogen, etc.

Any suitable number and configuration of forming gas anneals may be performed. Annealing may be done at about 400° C. for about 120 minutes, for example, or longer (e.g., 3 or 4 hours). Higher temperatures and longer times are possible.

A substrate 20 may be formed as discussed above. An adhesion layer 22 of, for example, titanium nitride may be formed over the substrate by PEALD, for example.

With reference to block 102 of FIG. 2, a layer of source/drain material, e.g., ruthenium, is formed over the adhesion layer 22. The source/drain material may be formed by sputtering to a desired thickness. In various examples, the layer of source/drain material is formed at a temperature of between about 20° C. and about 250° C.

The layer of source/drain material is then patterned to form separate bodies of source and drain material 30, 32 and define a gap therebetween. Lithography and etching, such as inductively coupled plasma reactive ion etching (ICP-RIE), may be used to form the bodies of source and drain material 30, 32. The adhesion layer 22, if used, should also be etched to avoid shorting the source 12 and drain 14.

Figure 3:
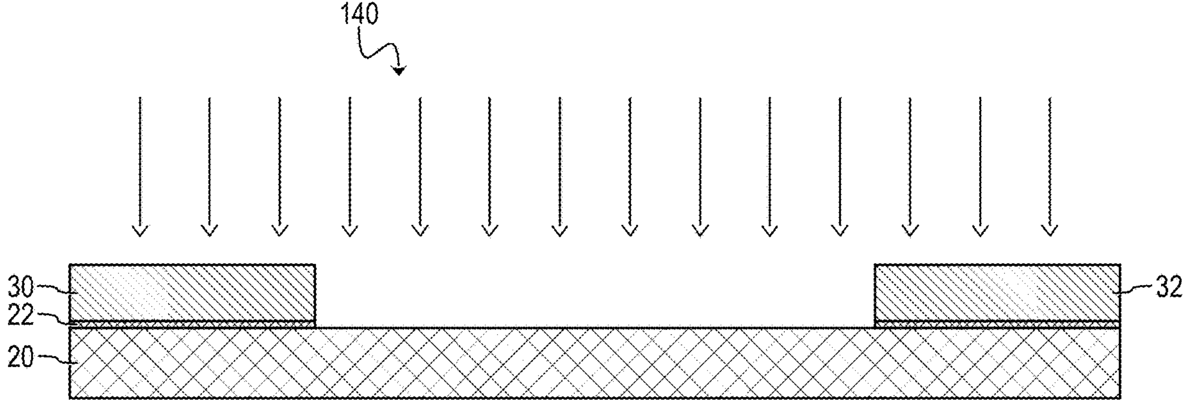
FIG. 3 is a cross-sectional view of an example process of treating a source/drain of metal to obtain a source/drain channel interface including a nitrogen-containing metal oxide.

FIG. 3 shows an intermediate product including the substrate 20, the adhesion layer 22, and the bodies of source and drain material 30, 32. The interface layer 22 and the bodies of source and drain material 30, 32 have been etched to isolate the bodies of source and drain material 30, 32 from each other, leaving a gap between them.

As shown at block 104 of FIG. 2 and in FIG. 3, the source and drain channel interfaces 40, 42 are formed. This may include treating the bodies of source and drain material 30, 32 with plasma 140. A sequence of one or more plasmas 140 may be used. A sequence may be repeated two or more times. In examples that have separate applications of oxygen and nitrogen, it is preferred that the oxygen be applied before the nitrogen, as oxide formation may be inhibited by a layer of nitride. As discussed above, the resulting source and drain channel interfaces 40, 42 include nitrogen-containing ruthenium oxide.

In various examples, the plasma treatment is as follows (in the order listed):

1. Argon (about 95%) and hydrogen (about 5%) at about 190° C. for about 10 seconds; and
2. Nitrogen-containing plasma at about 190° C. for about 15 to 120 seconds (e.g., 90 seconds), where the nitrogen-containing plasma is formed from any one or combination of nitrous oxide, nitrogen dioxide, and nitric oxide. In this case, the nitrogen-containing plasma is also an oxygen-containing plasma.

In various examples, the plasma treatment is as follows (in the order listed):

1. Argon (about 95%) and hydrogen (about 5%) at about 190° C. for about 10 seconds;
2. Oxygen ($O_2$) plasma at about 190° C. for about 15 to about 120 seconds (e.g., about 60 seconds); and
3. Nitrogen-containing plasma at about 190° C. for about 15 to about 120 seconds (e.g., about 90 seconds), where the nitrogen-containing plasma is formed from any one or combination of nitrous oxide, nitrogen dioxide, and nitric oxide. In this case, the nitrogen-containing plasma is also an oxygen-containing plasma that supplements the initial oxygen plasma.

In various examples, the plasma treatment is as follows (in the order listed):

1. Argon (about 95%) and hydrogen (about 5%) at about 190° C. for about 10 seconds;
2. Oxygen ($O_2$) plasma at about 190° C. for about 15 to 120 seconds (e.g., 60 seconds); and
3. Nitrogen-containing plasma at about 190° C. for about 15 to 90 seconds (e.g., 30 seconds), where the nitrogen-containing plasma is formed from any one or combination of ammonia and ammonium.

In various examples, the plasma treatment is as follows (in the order listed):

1. Argon (about 95%) and hydrogen (about 5%) at about 190° C. for about 10 seconds;
2. Oxygen ($O_2$) plasma at about 190° C. for about 15 to about 120 seconds (e.g., about 60 seconds); and
3. Nitrogen ($N_2$) plasma at about 190° C. for about 10 to 60 seconds (e.g., 30 seconds).

In various examples, the plasma treatment is as follows (in the order listed):

1. Argon (about 95%) and hydrogen (about 5%) at about 190° C. for about 10 seconds;
2. A mix of oxygen ($O_2$) and nitrogen ($N_2$) plasma at about 190° C. for about 15 to about 120 seconds (e.g., about 60 seconds). In this case, the nitrogen-containing plasma is also an oxygen-containing plasma.

In various examples, a non-plasma treatment is as follows (in the order listed):

1. Argon (about 95%) and hydrogen (about 5%) at about 190° C. for about 10 seconds;
2. Oxygen ($O_2$) plasma at about 190° C. for about 15 to 120 seconds (e.g., 60 seconds); and
3. Expose the surface of the source/drain material to ammonia and/or ammonium in a non-plasma state. Ammonia and/or ammonium provides a source of nitrogen that freely bonds to ruthenium oxide.

Note that the times and temperatures are subject to optimization based on specific implementation requirements. Argon carrier gas may be used where appropriate. Between steps, the chamber may be evacuated and/or flushed with inert gas.

In addition, if chlorine, fluorine, iodine, bromine, or other material is to be introduced to the channel interfaces 40, 42, then an additional plasma of chlorine, fluorine, iodine, bromine, etc. may be applied. For example, any of the above treatments may be supplemented with chlorine ($Cl_2$) plasma at about 190° C. for about 10 to about 60 seconds (e.g., about 30 seconds). This additional plasma may be applied before or after the oxygen or nitrogen-containing plasma. For example, chlorine plasma may be applied immediately after the application of argon and hydrogen. In some examples, chlorine, fluorine, iodine, or bromine may be introduced in a non-plasma state, such as a gas. In some examples, chlorine, fluorine, iodine, or bromine may be introduced as a compound, such as hydrochloric acid (HCl) in the case of chlorine.

In some cases, the introduction of nitrogen to the ruthenium oxide channel interface makes the interface more p-type, while the introduction of chlorine, fluorine, iodine, bromine, etc. can make the interface less p-type.

Further, the step of applying argon and hydrogen discussed in the various examples above may be replaced by forming gas. The argon and hydrogen or forming gas can be used to clean the source/drain material. Other cleaning techniques may additionally or alternatively be used.

Subsequently, as shown at block 106, a layer of channel material 50 is formed over the bodies of source and drain material 30, 32 and over the substrate 20 within the gap between the bodies of source and drain material 30, 32.

The layer of channel material 50, e.g., tin oxide, may be formed by PEALD with oxygen plasma, T-ALD, or similar technique. In various examples, chlorine, fluorine, nitrogen, or other chemical species may be introduced during the deposition process, so that the layer of channel material 50 includes such species.

When tin oxide is used as the layer of channel material 50, annealing may be useful to develop and/or maintain the preferred crystallite orientation discussed above. Annealing may be performed immediately after deposition of the layer of channel material 50 or at a later stage. Example anneal conditions are 400° C. for 120 minutes with forming gas.

Gate dielectric material is then formed over the tin oxide channel material. This may be done in two separate deposition and patterning operations. After an initial deposition of gate dielectric material, the gate dielectric material and underlying channel material may be patterned together using the same mask. Then, to prevent the channel material from shorting to the body of gate material 54, a second layer of gate dielectric material may be deposited and patterned in a manner that encapsulates the channel material, as shown at 66 in FIG. 1. Alternatively, a single deposition and patterning operation may be used to form the gate dielectric material.

The initial layer of gate dielectric material is formed over the layer of channel material. A layer of hafnium oxide may be formed by PEALD with oxygen plasma, T-ALD, or similar technique. The initial layer of hafnium oxide may be deposited to a desired thickness, such as about 5 nm.

The layers of tin oxide and hafnium oxide are then patterned. Lithography and etching, such as ICP-RIE, may be used. The same mask may be used to give the same pattern to both layers. This patterning completes the body of channel material 50.

The second layer of gate dielectric material is then formed over the patterned initial layer of gate dielectric material. PEALD, T-ALD, etc. may be used, as discussed above. The second layer of hafnium oxide may be deposited to a desired thickness, such as about 7.5 nm.

The second layer of gate dielectric material is then patterned. Lithography and etching, such as ICP-RIE, may be used. The pattern used to form the second layer of gate dielectric material should be larger than the pattern used to form the initial layer of gate dielectric material and channel material, so that edges of the body of channel material 50 are covered by gate dielectric material, as shown at 66 in FIG. 1. This patterning completes the body of gate dielectric material 52.

Then, a layer of gate material is formed. In this example, the layer of gate material ultimately forms the body of gate material 54 and the source and drain electrodes 60, 62. The layer of gate material may be formed by sputtering material as described above.

The layer of gate material may then be patterned to form the separate body of gate material 54 and source and drain electrodes 60, 62. Lithography and etching, such as ICP-RIE, may be used.

Thus, a transistor 10 of the structure shown in FIG. 1 is formed. Further forming may be performed, such as annealing, as may be required for the particular application of the TFT 10.

In view of the above, it should be apparent that a TFT with an oxide channel interface may be formed with the aid of nitrogen. The nitrogen in the channel interface can improve the stability and toughness of the interface material. This can in turn improve the manufacturability and operating life of the TFT.

Auxiliary verbs "can" and "may" are used interchangeably herein to denote components, features, and/or aspects of the present invention that are capable, configurable, selectable, modifiable, or optional, as would be apparent to one of ordinary skill in the art given the benefit of this disclosure. These terms should not be taken as limiting the present invention, unless otherwise specified.

Spatial prepositions, such as "over", "under", "above", "below", "up", "down", "beside", etc., are provided for sake of explanation and should not be taken as limiting the present invention to an absolute spatial orientation or arrangement, unless otherwise specified. For example, one of ordinary skill in the art would understand that a first element is above or below a second element depending on the perspective of the observer.

The articles "a", "an", "the", "said", etc. indicate singular and plural, unless otherwise specified.

The conjunction "or" is used inclusively and should be understood to mean "and/or", unless otherwise specified.

Sets of elements A, B, C described as A, B, or C; A, B, and C; A, B, and/or C; or A, B, C should be considered open sets from which one or more elements or a combination of one or more elements may be selected, unless otherwise specified. Sets of elements are open, unless specified to be closed, for example, by use of the term "consist", "consisting", or similar closed language.

The above clarifications apply to both the specification and claims.

The figures are not to scale, unless otherwise specified.

The above-described embodiments of the invention are intended to be examples of the present invention and alterations and modifications may be effected thereto, by those of ordinary skill in the art, without departing from the scope of the invention which is defined solely by the claims appended hereto.

What is claimed is:

1. A thin-film transistor comprising:

a source including a body of source material, the body of source material including ruthenium;

a drain including a body of drain material;

a gate;

a body of semiconductor channel material between the source and the drain, the body of semiconductor channel material including tin oxide; and a source-channel interface between the body of source material and the body of semiconductor channel material, the source-channel interface including a nitrogen-containing ruthenium oxide.

2. The thin-film transistor of claim 1, further comprising:

a drain-channel interface between the body of drain material of the drain and the body of semiconductor channel material;

wherein the drain-channel interface includes a nitrogen-containing metal-oxide.

3. The thin-film transistor of claim 1, wherein the source-channel interface comprises 15% or less nitrogen.

4. The thin-film transistor of claim 1, wherein the source-channel interface further comprises 1% or less chlorine.

5. The thin-film transistor of claim 1, wherein the source-channel interface further comprises 1% or less fluorine.

6. A method of manufacturing a thin-film transistor comprising:

forming a body of source material, the body of source material including ruthenium;

forming a source-channel interface at the body of source material, the source-channel interface including a nitrogen-containing ruthenium oxide; and forming a body of semiconductor channel material including tin oxide in contact with the source-channel interface;

wherein forming the source-channel interface comprises applying a nitrogen-containing plasma to the body of source material.

7. The method of claim 6, wherein the nitrogen-containing plasma is formed with any one or combination of nitrous oxide, nitrogen dioxide, and nitric oxide.

8. The method of claim 6, wherein the nitrogen-containing plasma is formed with any one or combination of ammonia and ammonium.

9. The method of claim 6, wherein forming the source-channel interface further comprises applying an oxygen-containing plasma to the body of source material.

10. The method of claim 6, further comprising:

forming a body of drain material;

forming a drain-channel interface at the body of drain material; and wherein the tin oxide of the body of semiconductor channel material is in contact with the drain-channel interface; and wherein forming the drain-channel interface comprises applying the nitrogen-containing plasma to the body of drain material.

11. The method of claim 6, wherein forming the source-channel interface further comprises applying chlorine plasma to the body of source material.

12. The method of claim 6, wherein forming the source-channel interface further comprises applying fluorine plasma to the body of source material.

13. A thin-film transistor comprising:

a source including a body of source material formed of ruthenium;

a drain including a body of drain material formed of ruthenium;

a body of semiconductor channel material between the source and the drain, the body of semiconductor channel material including tin oxide;

a source-channel interface at the body of source material and in contact with the body of semiconductor channel material, the source-channel interface including a nitrogen-containing ruthenium oxide; and a drain-channel interface at the body of drain material and in contact with the body of semiconductor channel material, the drain-channel interface including the nitrogen-containing ruthenium oxide.

14. The thin-film transistor of claim 13, wherein the source-channel interface and the drain-channel interface comprise 15% or less nitrogen.

* * * * *